United States Patent
Yi et al.

(10) Patent No.: US 12,029,121 B2
(45) Date of Patent: Jul. 2, 2024

(54) METHOD FOR PRODUCING HEUSLER-BASED PHASE THERMOELECTRIC MATERIAL USING AN AMORPHOUS PHASE PRECURSOR AND DEVICE USING HEUSLER-BASED PHASE THERMOELECTRIC MATERIAL PRODUCED BY THE METHOD

(71) Applicants: Kyungpook National University Industry-Academic Cooperation Foundation, Daegu (KR); Korea Advanced Institute of Science and Technology, Daejeon (KR)

(72) Inventors: Seong Hoon Yi, Daegu (KR); Gi Tae Park, Gyeongsan-si (KR); Seong Tae Kim, Daegu (KR); Pyuck Pa Choi, Daejeon (KR); Chan Won Jung, Daejeon (KR)

(73) Assignees: Kyungpook National University Industry-Academic Cooperation Foundation, Daegu (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 17/528,606

(22) Filed: Nov. 17, 2021

(65) Prior Publication Data
US 2022/0158067 A1    May 19, 2022

(30) Foreign Application Priority Data
Nov. 18, 2020  (KR) .................... 10-2020-0154556

(51) Int. Cl.
*H10N 10/01*    (2023.01)
*C22C 1/04*     (2023.01)
(Continued)

(52) U.S. Cl.
CPC ............. *H10N 10/01* (2023.02); *C22C 1/045* (2013.01); *C22C 45/10* (2013.01); *H10N 10/853* (2023.02); *C22C 2200/02* (2013.01)

(58) Field of Classification Search
CPC ......... H01L 35/18; H01L 35/34; H01N 10/01; H01N 10/853; C22C 45/10; C22C 1/045
See application file for complete search history.

(56) References Cited

U.S. PATENT DOCUMENTS

| | | | |
|---|---|---|---|
| 10,008,653 B2 | 6/2018 | Joshi et al. | |
| 2004/0261833 A1* | 12/2004 | Ono | H10N 10/853 136/236.1 |
| 2015/0270465 A1* | 9/2015 | Joshi | C22C 33/0278 419/33 |

FOREIGN PATENT DOCUMENTS

| | | | |
|---|---|---|---|
| JP | 2006165125 A | * | 6/2006 |
| KR | 10-2001-0048208 A | | 6/2001 |

OTHER PUBLICATIONS

Espacenet Machine Translation of JP 2006165125 (Year: 2023).*
(Continued)

*Primary Examiner* — Alexandra M Moore
(74) *Attorney, Agent, or Firm* — NSIP Law

(57) ABSTRACT

Disclosed is a method for producing a Heusler-based phase thermoelectric material using an amorphous phase precursor. More specifically disclosed is a method for producing a powder or bulk thermoelectric material having a microstructure including a Heusler-based phase with a thermoelectric effect by crystallization of an amorphous phase precursor prepared by a non-equilibrium processes. Also disclosed is a device using a Heusler-based phase thermoelectric material produced by the method. The method largely avoids the efficiency problems of conventional methods, including low productivity in scaling up caused by long annealing time, high annealing temperature, and contamination during nano-
(Continued)

powder production, achieving improved process efficiency. In addition, the method enables efficient production of a thermoelectric material having a nano-sized microstructure that is difficult to produce by a conventional method.

7 Claims, 12 Drawing Sheets

(51) Int. Cl.
    *C22C 45/10*     (2006.01)
    *H10N 10/853*     (2023.01)

(56) References Cited

OTHER PUBLICATIONS

Ran He, Lihong Huang, Yumei Wang, Georgy Samsonidze, Boris Kozinsky, Qinyong Zhang, Zhifeng Ren; Enhanced thermoelectric properties of n-type NbCoSn half-Heusler by improving phase purity. APL Mater. Oct. 1, 2016; 4 (10): 104804. htttps://doi.org/10.1063/1.4952994 (Year: 2016).*

Shi et al. Prospective high thermoelectric performance of the heavily p-doped half-Heusler compound CoVSn Physical Review B 95 , 195207 (2017 DOI: 10.1103/PhysRevB.95.195207) (Year: 2017).*

Kurosaki et al. High temperature thermoelectric properties of CoNb1-xHfxSn1-ySby half-Heusler compounds Journal of Alloys and Compounds 377 (2004) 312-315 (Year: 2004).*

Yu et al. Reduced Grain Size and Improved Thermoelectric Properties of Melt Spun (Hf, Zr)NiSn Half-Heusler Alloys Journal of Electronic Materials vol. 39, No. 9 2010 DOI: 10.1007/s11664-009-1032-8 (2009) (Year: 2009).*

* cited by examiner

METHOD FOR PRODUCING HEUSLER-BASED PHASE THERMOELECTRIC MATERIAL USING AN AMORPHOUS PHASE PRECURSOR AND DEVICE USING HEUSLER-BASED PHASE THERMOELECTRIC MATERIAL PRODUCED BY THE METHOD

CROSS REFERENCE TO RELATED APPLICATIONS

This application claims the benefit under 35 USC 119(a) of Korean Patent Application No. 10-2020-0154556 filed on Nov. 18, 2020 in the Korean Intellectual Property Office, the entire disclosures of which are incorporated herein by reference for all purposes.

BACKGROUND OF THE INVENTION

1. Field of the Invention

The present invention relates to a method for producing a Heusler-based phase thermoelectric material using an amorphous phase precursor and a device using a Heusler-based phase thermoelectric material produced by the method. More specifically, the present invention relates to a method for producing a powder or bulk thermoelectric material having a microstructure including a Heusler-based phase by crystallization of an amorphous phase precursor prepared by non-equilibrium processes, and a device using a thermoelectric material produced by the method.

2. Description of the Related Art

Amorphous alloys are metallic materials whose atomic arrangement has a short-range order. The production of amorphous alloys requires alloy design and non-equilibrium processing techniques that are capable of enhancing glass forming ability. Examples of the non-equilibrium processes include rapid solidification and mechanical alloying processes. The production of amorphous ribbons by rapid solidification was reported in the mid-20th century. Since then, alloy design techniques have been continuously improved and recently, bulk amorphous alloys have been reported that can be used to manufacture bulk amorphous parts due to their high glass forming ability.

Amorphous matrices have no compositional variation and no defects such as grain boundaries over the entire region of the materials, ensuring their chemical and microstructural homogeneities. Amorphous matrices are thermodynamically metastable phases and are easily transformed into nano-sized microstructures because they have a high nucleation rate and a low grain growth rate when crystallized around their glass transition temperatures. Accordingly, the use of amorphous phase precursors is advantageous for the production of homogeneous thermoelectric materials having nano-sized microstructures compared to the use of conventional processes.

Thermoelectric devices produce an electromotive force as a result of the migration of excited charge carriers due to a temperature gradient between high- and low-temperature regions to generate electricity. Thermoelectric materials are used as key materials of conversion devices and they are divided into p-type and n-type depending on whether their main charge carriers are electrons or holes. Thermoelectric materials are generally combined in the shape of the Greek letter pi (π). Since thermoelectric devices have a simple configuration for power generation and do not use fossil fuels for energy production, they have received attention as promising approaches for environmentally friendly and sustainable energy production. Considerable research efforts have recently been aimed at developing and mass-producing energy harvesting devices that collect waste heat from industrial facilities and internal combustion engines, and convert it into electricity. Thermoelectric devices use only a thermoelectromotive force as a source for energy production, unlike conventional power engines using chemical reactions for energy production. Thus, thermoelectric devices are widely used as power generation devices that utilize conduction heat from stars in environments where resources are scarce, such as space environments.

In Peltier devices, an electric current flows through a π-type circuit consisting of thermoelectric elements to form heating and cooling regions as high- and low-temperature regions of the thermoelectric elements, respectively. The heating and cooling regions change the ambient temperature. Peltier devices using mainly the cooling regions are applied as heat sinks and coolers for small appliances such as compact refrigerators and electronic appliances.

Thermoelectric materials are essential constituent materials for thermoelectric devices and Peltier devices and are responsible for the performance of the devices. Thermoelectric materials are divided into n-type and p-type and should have high dimensionless thermoelectric figure of merit (ZT) for their high performance.

The efficiency of a thermoelectric material can be explained by the Carnot process in which a heat engine achieves the maximum thermal efficiency, which can be expressed by Equation 1:

$$\eta_{max} = \frac{T_H - T_C}{T_H} \frac{\sqrt{1+ZT} - 1}{\sqrt{1+ZT} + \frac{T_C}{T_H}} \qquad (1)$$

where ZT is the dimensionless figure of merit.

The higher the ZT value, the higher the thermal efficiency of the thermoelectric material.

The dimensionless figure of merit, ZT, can be expressed by Equation 2:

$$ZT = S^2 \sigma / \kappa \qquad (2)$$

wherein σ is the electrical conductivity (or ρ is the electrical resistance), κ is the thermal conductivity, and S is the Seebeck coefficient.

Equation 2 mathematically describes that the ZT value is increased by increasing the Seebeck coefficient and electrical conductivity, and decreasing the thermal conductivity, resulting in an improvement in the performance of the thermoelectric device. The thermal conductivity is divided into two terms: electronic thermal conductivity and lattice thermal conductivity. The electronic thermal conductivity has a proportional relationship with the electrical conductivity. That is, as the electrical conductivity increases, the electronic thermal conductivity increases. Therefore, a decrease in the lattice thermal conductivity is needed to improve the electrical properties and the figure of merit. The Seebeck coefficient and the electrical conductivity are greatly affected by the charge carrier concentration. In conclusion, a thermoelectric material with a high figure of merit can be synthesized by deriving optimum Seebeck coefficient, electrical conductivity, and thermal conductivity values within an optimized charge carrier concentration range in the corresponding thermoelectric material.

The thermal conductivity can be divided into electronic thermal conductivity and lattice thermal conductivity. A strategy to reduce the lattice thermal conductivity is applied as an effective method to improve the figure of merit of the thermoelectric material. The lattice thermal conductivity can lower the overall thermal conductivity by inducing the scattering of phonons that transfer heat by the vibrational motion of atoms between lattices. Various methods such as nanophase formation and lattice element substitution are used for phonon scattering.

Half-Heusler thermoelectric materials have long lifetime, high durability, and excellent electrical properties in the intermediate temperature range of 300° C. to 800° C. and are composed of materials relatively abundant in the Earth's crust. Due to these advantages, half-Heusler thermoelectric materials are expected to replace conventional Te based thermoelectric materials in the intermediate temperature region. Many previous studies have been conducted to reduce the very high thermal conductivity of half-Heusler thermoelectric materials. Some of these studies have succeeded in forming nano-sized Heusler phases forming coherent planes in existing half-Heusler matrices to form nano-sized microstructures capable of selectively using high-energy charge carriers, increasing figures of merit based on the reduction of thermal conductivities resulting from the reduction of lattice regularity, and introducing inclusions helpful for electrical properties to reduce thermal conductivities.

Based on such various case studies, research has been conducted to increase figure of merit. However, half-Heusler alloys as metal-based compounds are vulnerable to the inflow of impurities during processing due to their relatively high mechanical properties compared to existing heavy metal semiconductor based thermoelectric materials. Under the influence of this malicious doping, the performance of the half-Heusler alloys tends to deteriorate. The half-Heusler alloys require annealing at high temperatures for a long time, causing side effects such as elution of alloying elements that make process control very difficult, compared to the existing heavy metal based thermoelectric materials. The formation of nanoscale is limited to the pulverization method described in U.S. patent Ser. No. 10/008,653B2 (Patent Document 1). Consequently, it is essential to develop new industrially applicable processes and techniques for producing thermoelectric materials on an industrial scale while effectively avoiding the above-mentioned side effects caused by high-difficulty process control techniques.

RELEVANT PRIOR ART

Prior Art Patent (Patent Reference 1) U.S. Pat. No. 10,008,653

SUMMARY OF THE INVENTION

The present invention has been made in an effort to solve the above-described problems, and an object of the present invention is to provide a method for producing a half-Heusler thermoelectric material using an amorphous phase and a device using a half-Heusler phase-based thermoelectric material produced by the method.

One aspect of the present invention provides a method for producing a Heusler-based phase thermoelectric material, including forming an amorphous matrix phase from a liquid phase, a solid phase, a gas phase or a fourth phase and applying thermal energy, mechanical energy or physical energy into the amorphous matrix phase to form a thermoelectric phase (crystallization).

The thermoelectric phase is represented by Formula 1:

$$X_a Y_b Z_c W_d \quad (1)$$

wherein X is a metal selected from the group consisting of V, Nb, and Ta, Y is a metal selected from the group consisting of Fe, Co, and Ni, Z is a metal or metalloid selected from the group consisting of Sn and Si, W is a metal or metalloid selected from the group consisting of Sb and Bi, and a, b, c, and d satisfy $0<a\le1$, $0<b\le2$, $0<c\le1$, $0\le d<0.1$, respectively.

Another aspect of the present invention provides a device using a thermoelectric material produced by the method.

The method of the present invention largely avoids the efficiency problems of conventional methods, including low productivity in scaling up caused by long annealing time, high annealing temperature, and contamination during nano-powder production, achieving improved process efficiency.

In addition, the method of the present invention enables efficient production of a thermoelectric material having a nano-sized microstructure that is difficult to produce by a conventional method.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

The present invention will now be described in more detail.

The present invention macroscopically includes all matters related to alloy compositions and process control. Microstructures obtained based on these matters may include thermodynamically metastable phases.

According to one aspect of the present invention, there is provided a method for producing a Heusler-based phase thermoelectric material, including forming an amorphous matrix phase from a liquid phase, a solid phase, a gas phase or a fourth phase and applying thermal energy, mechanical energy or physical energy into the amorphous matrix phase to form a thermoelectric phase (crystallization) wherein the thermoelectric phase is represented by Formula 1:

$$X_a Y_b Z_c W_d \qquad (1)$$

wherein X is a metal selected from the group consisting of V, Nb, and Ta, Y is a metal selected from the group consisting of Fe, Co, and Ni, Z is a metal or metalloid selected from the group consisting of Sn and Si, W is a metal or metalloid selected from the group consisting of Sb and Bi, and a, b, c, and d satisfy $0<a\le1$, $0<b\le2$, $0<c\le1$, $0\le d<0.1$, respectively. In Formula 1, furthermore, X may be Ti, Zr or Hf. A small amount of at least one of B, C, and P may be further added to achieve improved glass forming ability.

The amorphous matrix phase may be formed by rapid solidification, melt spinning, splat quench, gas atomization, water atomization, mechanical alloying, mechanical energy injection, condensation or deposition.

The crystallization step may be carried out using annealing, ball milling, hand milling, laser and/or electric pulse. The annealing may be performed using a direct or indirect heat source at 800° C. or less. More preferably, the annealing temperature is from 400 to 600° C. If the annealing temperature is lower than 400° C., the crystallization is not satisfactorily performed. Meanwhile, if the annealing temperature exceeds 800° C., an undesirable full-Heusler phase is predominantly formed. The annealing temperature is not limited to the range defined above and may vary depending on the composition of the alloy materials. The size, type, and shape of the resulting crystal phase may be determined by controlling the crystallization temperature in consideration of the composition of the alloy materials. A microstructure, the shape of grains, and the ratio of a half-Heusler phase and a full-Heusler phase may be adjusted depending on the temperature region.

Figure 25:
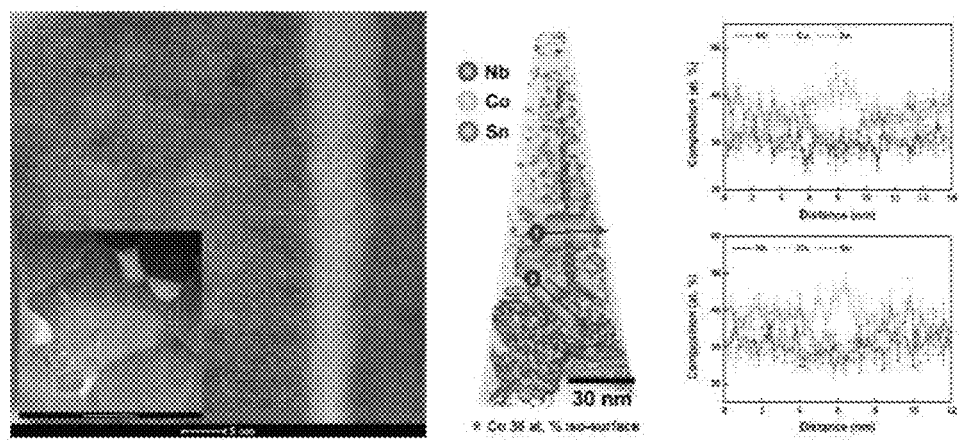
FIG. 25 shows a STEM image, 3d atom map and composition profiles across the grain boundaries obtained by atom probe tomography (APT) experiment for $NbCo_{1.1}Sn$ alloy after heat treatment at 893 K for 2 h according to an exemplary embodiment of the present invention.

The formation of the crystal by controlling the annealing temperature for the amorphous matrix phase leads to the formation of a full-Heusler phase in the form of films at the grain boundaries by the excess elements. In particular, the smaller the grain size, the easier the formation of the full-Heusler phase films. The shape of the phase may vary depending on the annealing temperature and the composition of the alloy. Thus, a delta-shaped full-Heusler phase can be formed at the grain edges. This phase is distinguished from equiaxed or needle-like full-Heusler phases formed in grains. FIG. 25 is a transmission electron microscopy image of a full-Heusler phase according to an exemplary embodiment of the present invention. Referring to FIG. 25, the full-Heusler phase is formed in the form of films along the grain boundaries. The triangular phase can be confirmed from FIG. 3 in Example 1.

From the viewpoints of homogenization and nano-structuring, a conventional method for producing a thermoelectric material requires a separate homogenization process and forming a nano-sized powder. In contrast, the method of the present invention includes forming an amorphous matrix phase and crystallizing the amorphous phase matrix to obtain a nanostructure that is homogeneous and fine as a whole. The method of the present invention is characterized in that any homogenization process is not required and annealing is performed at a low temperature to form a nanostructure.

The method of the present invention may further include sintering the thermoelectric phase for bulking after the crystallization step. The thermoelectric phase is pulverized into a powder having a size of several to hundreds of μm by a conventional process and the powder is bulked with several processes. Examples of suitable bulking processes include conventional powder metallurgy sintering processes and other sintering processes, powder extrusion, and powder rolling.

According to another aspect of the present invention, there is provided a device using a thermoelectric material produced by the method. The device of the present invention is excellent in that its thermoelectric efficiency is enhanced depending on the homogenization and stabilization of the half-Heusler phase and the nano-sized crystal phase.

The present invention is aimed at avoiding the occurrence of segregation during solidification and the resulting formation of a heterogeneous microstructure and solving the problems of high energy consumption for long-term annealing at high temperature and low productivity. According to the present invention, a chemically and structurally homogeneous amorphous precursor having a desired composition is prepared by a non-equilibrium process and is then crystallized to produce a thermoelectric material having a microstructure including thermoelectric phase(s). In addition, a device using the thermoelectric material is fabricated. The thermoelectric efficiencies of the thermoelectric material having a nano-sized microstructure and the device can be maximized through control over the crystallization process of the amorphous phase.

Hereinafter, preferred embodiments of the present invention will be described in detail with reference to the accompanying drawings. The present invention relates macroscopically to an alloy composition and process control. The illustration and detailed description of configurations and their functions and effects, which can be easily understood by those skilled in the art, will be simplified or omitted, and the parts related to the present invention will be described in detail.

Example 1

An alloy having a composition represented by $NbCo_{1.1}Sn$ was produced by the following procedure. First, raw materials (purity≥99.9%) were weighed and melted in a vacuum arc melting furnace. To remove oxygen in the vacuum arc melting furnace chamber before melting, titanium was melted in another melting bath of the vacuum arc melting furnace chamber.

The molten materials were re-melted six or more times while turning upside down to secure compositional uniformity of an alloy ingot produced by vacuum arc melting. Finally, the re-molten materials were poured into a 12 mm diameter round copper mold to produce a rod-like ingot.

For non-equilibrium matrix formation, the rod-like ingot produced by vacuum arc melting was cut, followed by melt spinning to obtain a quenched specimen. The above procedure was repeated several times under the same conditions to obtain specimens enough for bulking and testing.

After melt spinning, the ribbon specimens were sealed in a high-purity argon gas atmosphere, followed by annealing at 783 K and 893 K for 2 h to prepare test pieces for the evaluation of thermoelectric and electrical properties.

Evaluation

Microstructures

Figure 1:
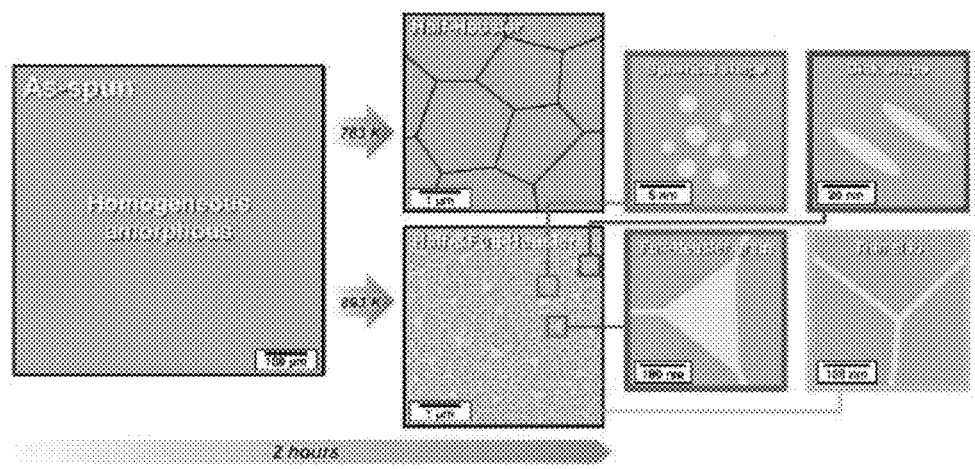
FIG. 1 shows schematic illustrations of a novel approach to fabricate the various nanostructures of half-Heuslers proposed in this study, based on crystallization of an amorphous precursor.
Figure 2:
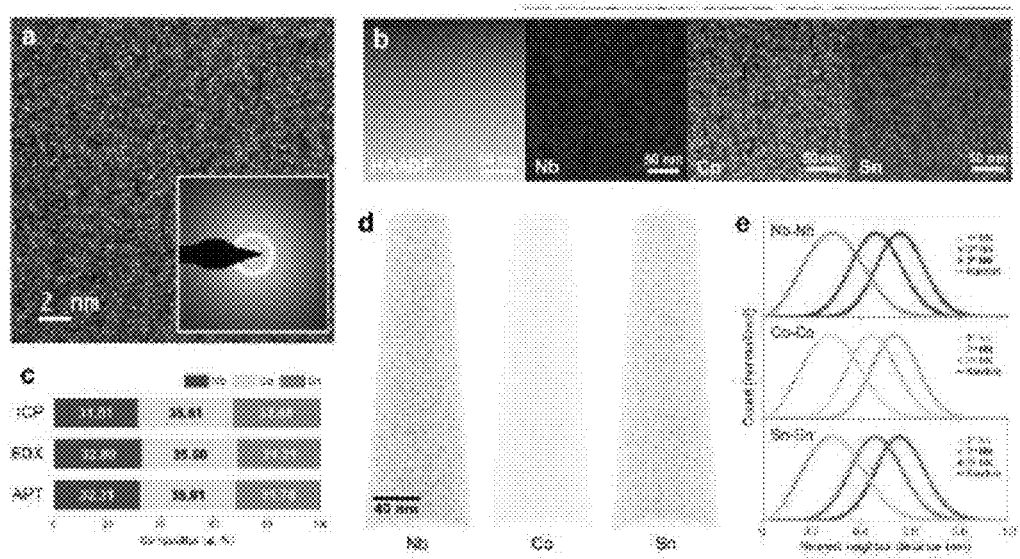
FIG. 2 shows an as-spun microstructure having a composition according to an exemplary embodiment of the present invention and its composition distribution.

An image of the microstructure before annealing is shown in FIG. 2. Specifically, FIG. 2 shows the results of high-resolution transmission electron microscopy (HR-TEM) and scanning transmission electron microscopy (HAADF-STEM) for the ribbon specimen. Referring to FIG. 2, the ribbon specimen was found to have a disordered non-equilibrium amorphous microstructure that was uniform in composition and was not crystalline. The compositional uniformity was confirmed by inductively coupled plasma-atomic emission spectroscopy (ICP-AES) and atom probe tomography (APT).

Figure 3:
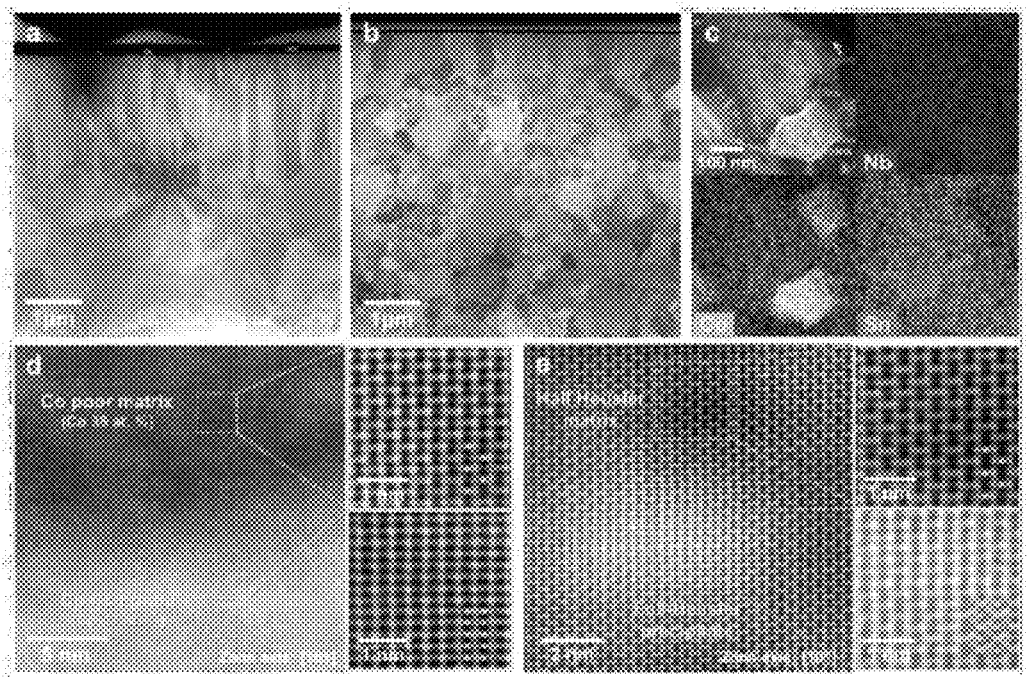
FIG. 3 shows scanning transmission electron microscopy (STEM) images of $NbCo_{1.1}Sn$ alloys after heat treatment at (a) 783 and (b) 893 K, respectively, for 2 h. (c) Energy dispersive X-ray spectroscopy (EDX) maps of the $NbCo_{1.1}Sn$ alloy after heat treatment at 893 K for 2 h. (d, e) STEM images of interfaces between Heusler and half-Heusler microstructure according to an exemplary embodiment of the present invention.
Figure 4:
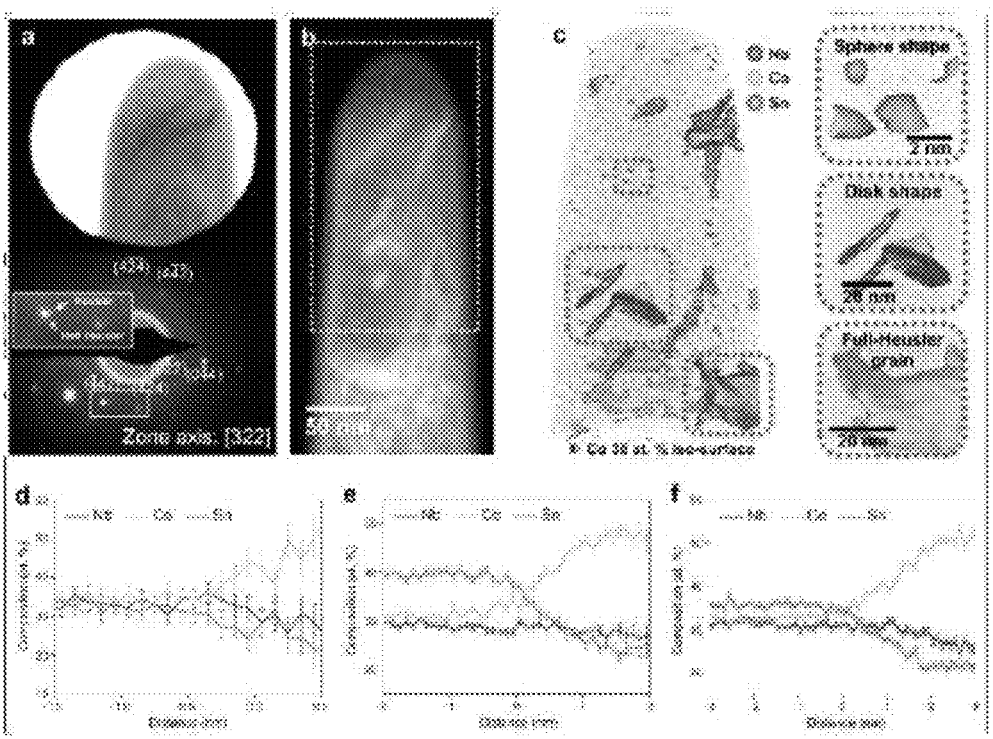
FIG. 4 shows (a) TEM image of an APT tip with aperture (SAED pattern included as an inset). (b) STEM-HAADF image, and (c) 3d atom maps and the proxigrams based on iso-concentration surfaces of 38 at % Co for (d) spherical nano-precipitates, (e) disk-shaped nano-precipitates, and (f) full-Heusler grain according to exemplary embodiments of the present invention for phase analysis and proxigrams of the compositions of the microstructures.

Images of the microstructures after annealing are shown in FIG. 3. Specifically, in FIG. 3, a and b are transmission electron microscopy images of the ribbons after annealing at different temperatures of 783 K and 893 K, respectively, and c, d, and e show EDX result of the ribbon annealed at 893 K obtained by transmission electron microscopy, high-resolution transmission electron microscopy images of grain boundaries of the ribbon annealed at 893 K, and their higher magnification images, respectively. Referring to FIG. 3, the interfaces between Heusler and half-Heusler phases were formed only when the annealing was performed at 893 K.

Analysis of Electrical Properties

The electrical properties of the ribbon specimens annealed at 783 K and 893 K were analyzed. The results are as follows.

Figure 5:
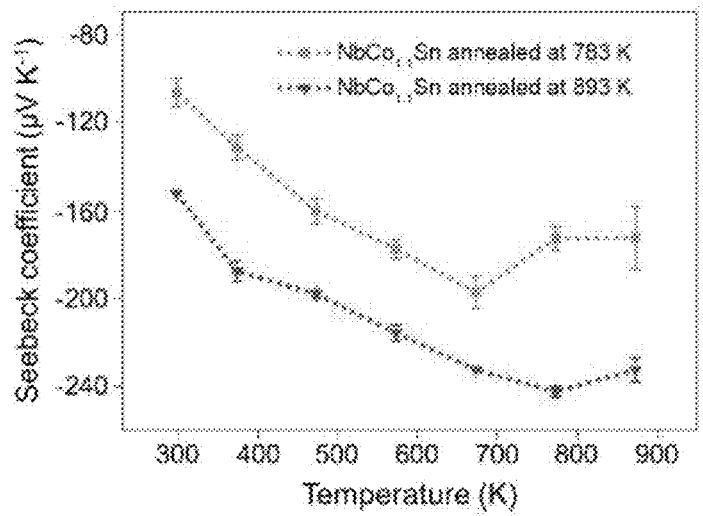
FIG. 5 shows the results of Seebeck coefficients of the $NbCo_{1.1}Sn$ after heat treatment at 783 and 893 K, respectively, for 2 h as a function of temperature according to exemplary embodiments of the present invention.
Figure 6:
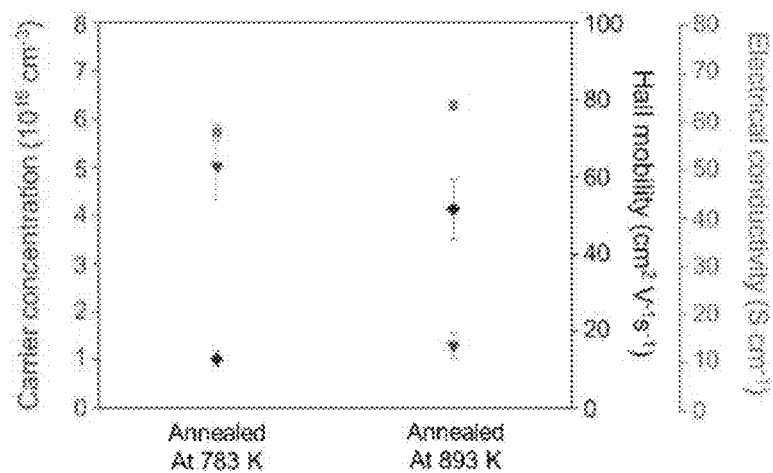
FIG. 6 shows the electrical properties of $NbCo_{1.1}Sn$ after heat treatment at 783 and 893 K, respectively, for 2 h at the room temperature according to exemplary embodiments of the present invention.

First, the electrical properties of the ribbon specimens were analyzed. The results are shown in FIGS. 5 and 6. Referring to FIGS. 5 and 6, the Seebeck coefficient, electron mobility, and electrical conductivity increased and the electron concentration decreased at the same time in the test pieces having the same alloy composition in which interfaces between Heusler and half-Heusler were formed according to the annealing conditions. These effects depended on the reduced scattering of charge carriers resulting from the decreased electron concentration, i.e. due to quantum confinement effects resulting from the formation of the half-Heusler with Heusler microstructure, which is described in the claims of the present invention.

To find the cause of the increased Seebeck coefficient, work functions were determined, and diagrams of electronic structures were plotted based on comparison of the results of photoelectron spectroscopy and first-principle density functional theory (DFT) calculations.

Figure 7:
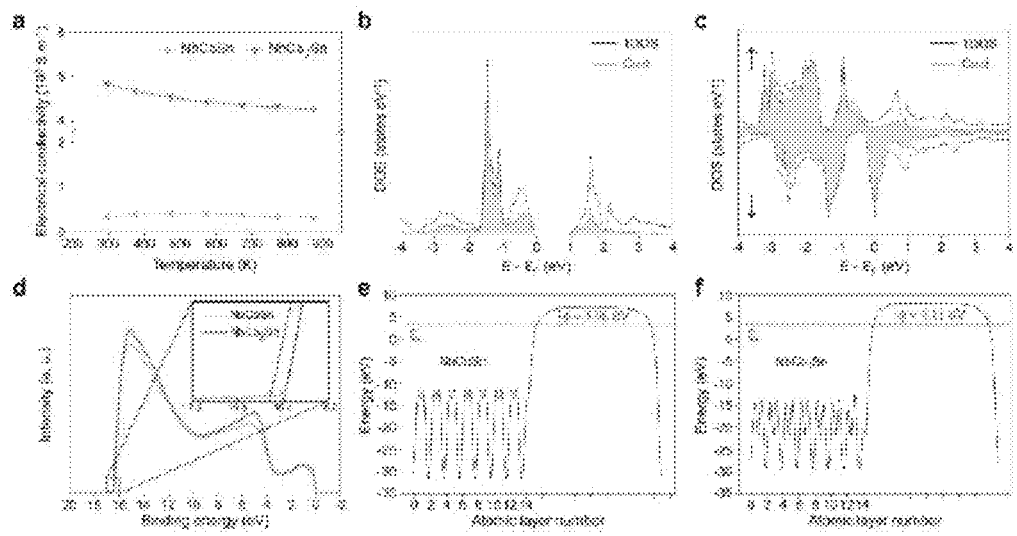
FIG. 7 shows (a) electrical conductivities of sintered specimens with half-Heusler and Heusler composition, density of states for (b) half-Heusler and (c) Heusler structure calculated using DFT. (d) Ultraviolet photoelectron spectroscopy (UPS) results and DFT calculations for work functions of (e) half-Heusler and (f) Heusler. according to exemplary embodiments of the present invention.

Analysis of Changes in Electrical Conductivity by First-Principle Density Functional Theory Calculations NbCoSn was identified as a nonmagnetic semiconductor with a bandgap of 1 eV by first-principle density functional theory calculations (see b of FIG. 7). This result was consistent with previous studies. In contrast, $NbCo_2Sn$ is a ferromagnetic material having charge carriers present in the up and down spin bands shown in c of FIG. 7. However, a bandgap exists just below the Fermi level in the minor spin band, which is similar to the behavior of type III or semimetal charge carriers. Consequently, the presence of charge carriers in the spin channels can explain the high electrical conductivity of NbCo$_2$Sn, which was experimentally determined.

Results of Ultraviolet Photoelectron Spectroscopy

Based on the results of ultraviolet photoelectron spectroscopy, the work functions of NbCoSn and NbCo$_2$Sn were calculated by the following equation:

$$\Phi = h\nu | E_F - E_{cutoff} |$$

where $\Phi$ is the work function, hv is the incident photon energy (21.2 eV for He 1), $E_F$ is the Fermi energy, and $E_{cutoff}$ is the cutoff energy. The Fermi energies of the two samples correspond to a binding energy of 0 eV. The binding energy increases with the emission of electrons at lower energy levels.

The analysis revealed that the cutoff energies of NbCoSn and NbCo$_2$Sn were 16.52 and 16.38 eV, respectively. As a result, the work functions of NbCoSn and NbCo$_2$Sn were determined to be 4.68 eV and 4.82 eV, respectively.

Density Functional Theory Calculations

In FIG. 7, e and f show the electrostatic potential energies of NbCoSn and NbCo$_2$Sn along the z-axis. The calculated work functions of NbCoSn and NbCo$_2$Sn were 3.96 eV and 4.11 eV, respectively. The difference in work function between both phases (4.82 eV-4.68 eV=0.14 eV) from the results of UV photoelectron spectroscopy was almost the same as that (4.11 eV-3.96 eV=0.15 eV) determined by the functional theory calculations. Therefore, the results of calculation and measurement are considered highly reliable.

Figure 8:
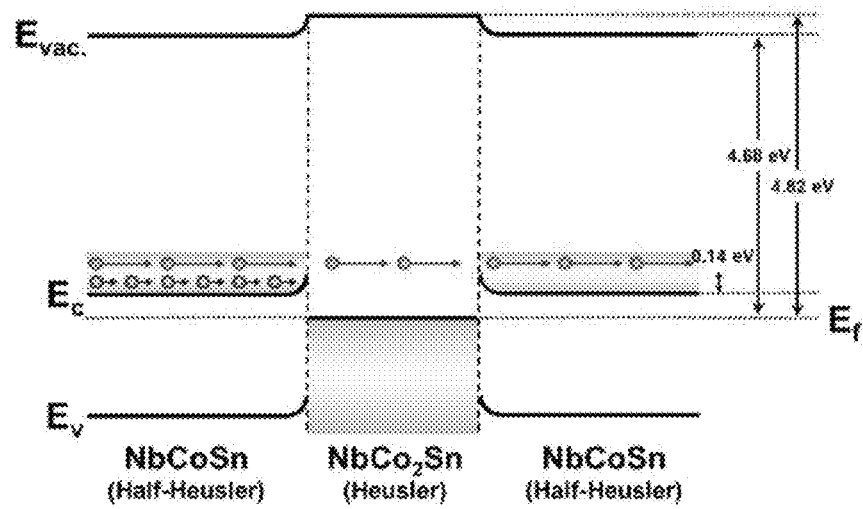
FIG. 8 shows schematic band diagram of the interface between NbCoSn and NbCo2Sn according to exemplary embodiments of the present invention.

FIG. 8 is a schematic diagram showing the conduction bands at the interfaces between NbCoSn and NbCo$_2$Sn. The conduction bands were obtained from the calculated and measured work functions. It is expected that Schottky contacts will be formed at the interfaces between NbCoSn and NbCo$_2$Sn. It is also expected that the conduction band of NbCoSn will be bent upward due to the work function difference. Consequently, it is expected that energy barriers of ~0.14 eV at the ends of the conduction bands of NbCoSn will filter low-energy charge carriers with low mobility. This is referred to as an energy filtering effect.

Example 2

The ribbon specimens prepared in Example 1 were subjected to ball milling at 150 RPM for different times (3, 10, and 20 h). The ratio of the balls to each specimen was 15:1. After the ball milling, the resulting powders were sieved into sizes of ≤20 μm, and sintered by spark plasma sintering. The sintering was performed with a heating rate of 100 K/min to different temperatures (853, 953, and 1053 K) at a pressure of 50 MPa. Each temperature was maintained for 5 min. As a result, bulk specimens were prepared from the amorphous precursor. The bulk specimens were processed to suit the purpose of measurement and their properties were evaluated.

Evaluation
Microstructures

Figure 9:
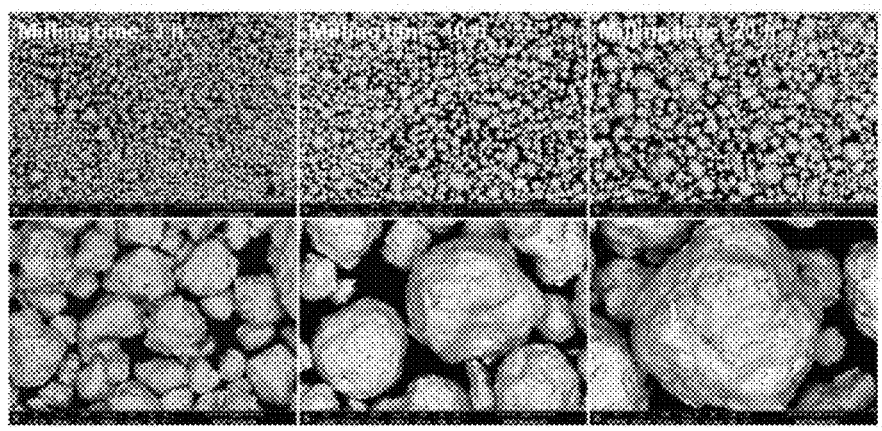
FIG. 9 shows scanning electron microscopy (SEM) images of powders according to different pulverization times of ribbon specimens prepared by rapid solidification according to exemplary embodiments of the present invention.
Figure 10:
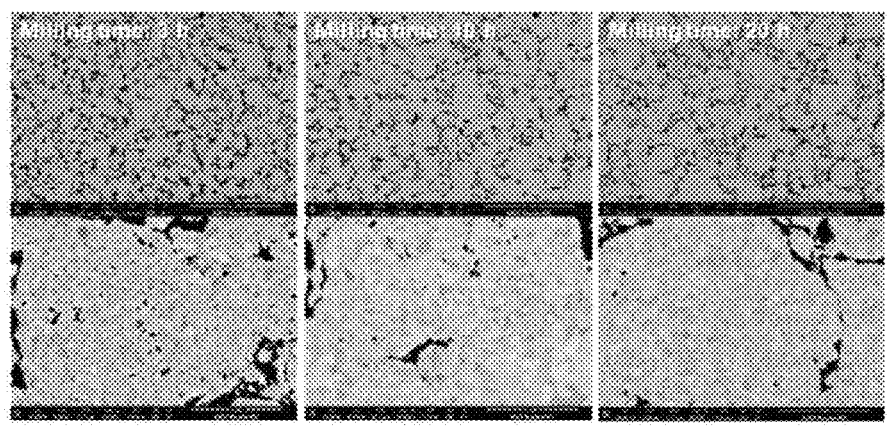
FIG. 10 shows SEM images of the sintered bulk specimens according to different pulverization times of ribbon specimens prepared by rapid solidification according to exemplary embodiments of the present invention.
Figure 11:
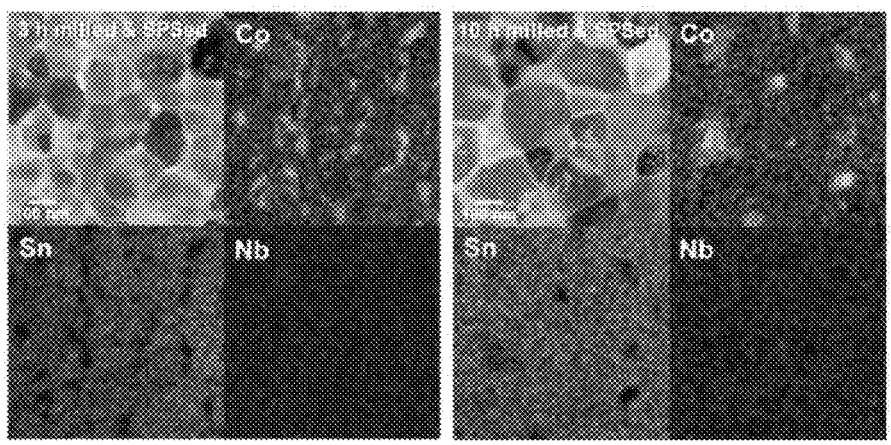
FIG. 11 shows STEM-EDX maps of sintered bulk specimens according to different pulverization times of ribbon specimens prepared by rapid solidification according to exemplary embodiments of the present invention.

FIG. 9 shows scanning electron microscopy images of the powders after ball milling Referring to FIG. 9, the powder aggregated and coarsened with increasing milling time. Scanning electron microscopy images of the powders after sintering are shown in FIG. 10. Referring to FIG. 10, many pores were observed in the specimen obtained after milling time for 3 h and relatively reduced numbers of pores were observed in the specimens obtained after milling for 10 and 20 h. In addition, nanoscale crystalline microstructures were observed in all three specimens. Transmission electron microscopy was used for more detailed observation of the microstructures. The results are shown in FIG. 11. Referring to FIG. 11, the crystal size of the specimen obtained after milling for a longer time was larger and Co-rich Heusler precipitates were also observed in both specimens.

Figure 12:
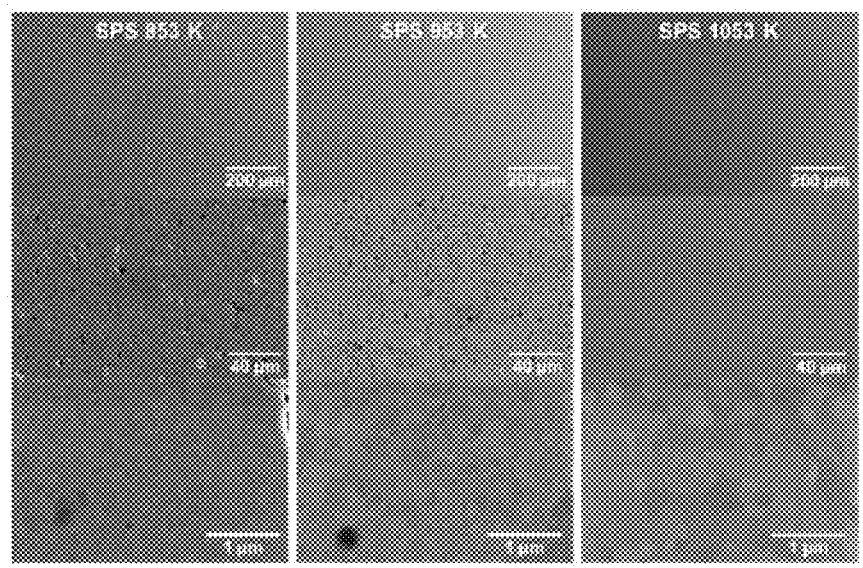
FIG. 12 shows SEM images of sintered bulk specimens at different temperatures for 15 minutes according to exemplary embodiments of the present invention.
Figure 13:
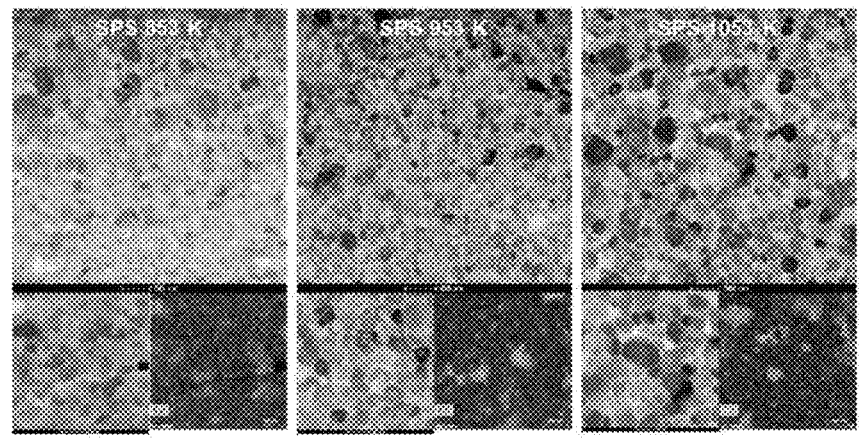
FIG. 13 shows STEM images of sintered bulk specimens at different temperatures for 15 minutes according to exemplary embodiments of the present invention.

Scanning electron microscopy images of the specimens obtained after spark plasma sintering at different temperatures of 853, 953, and 1053 K for densification of the bulk materials are shown in FIG. 12. The number of pores in the specimen sintered at 1053 K was significantly reduced compared to those in the other specimens. FIG. 13 shows transmission electron microscopy images of the specimens. Complex nanostructures containing Co-rich Heusler precipitates and half-Heusler crystals were observed in the specimens, as in the previous specimens.

Characterization

Figure 14:
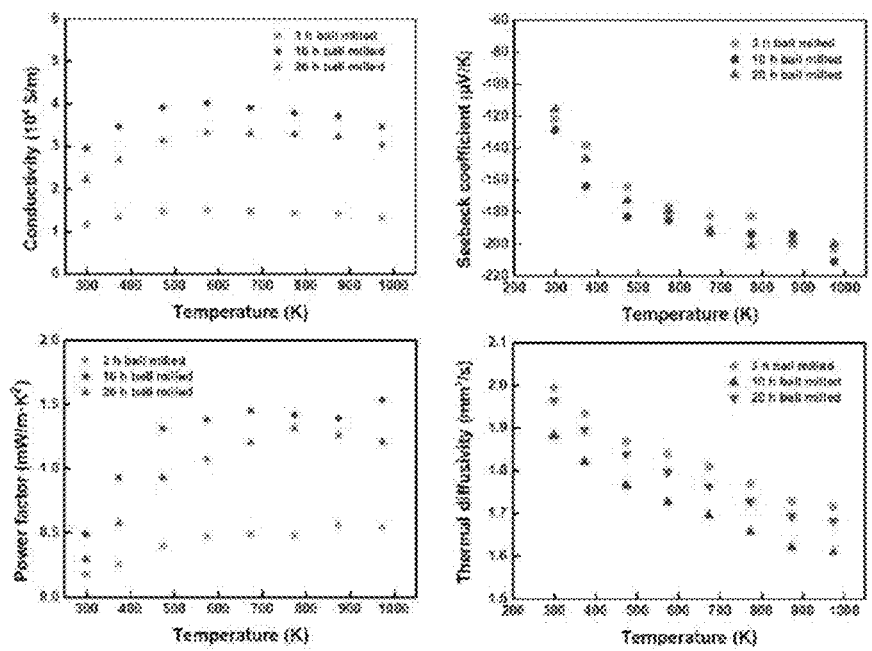
FIG. 14 shows the electrical conductivities, Seebeck coefficients, power factors, and thermal diffusivities of sintered specimens depending on the temperature obtained after spark plasma sintering of powders according to exemplary embodiments of the present invention according to different pulverization times.

The characteristics of the specimens obtained after ball milling for 3, 10, and 20 h and subsequent sintering were evaluated. The results are shown in FIG. 14. First, the electrical conductivity of the specimen obtained after ball milling for 3 h was rather low, which is presumed to be due to the presence of many pores. The minimum Seebeck coefficients were about −200 μV/K in all three specimens. The negative sign of Seebeck coefficients indicates that the specimens were n-type semiconductors. Power factors were calculated using the electrical conductivities and Seebeck coefficients. As a result, the largest power factor and the lowest thermal diffusivity were achieved in the specimen obtained after ball milling for 10 h.

Example 3

Compositions of ingots produced in a vacuum arc furnace are shown in Table 1.

TABLE 1

| Stoichiometric composition | Nb (at. %) | V (at. %) | Ta (at. %) | Co (at. %) | Sn (at. %) |
|---|---|---|---|---|---|
| #1 NbCoSn | 33.3333 | 0.0000 | 0.0000 | 33.3334 | 33.3333 |
| #2 Nb$_{0.8}$V$_{0.2}$CoSn | 26.6666 | 6.6667 | 0.0000 | 33.3334 | 33.3333 |
| #3 Nb$_{0.8}$Ta$_{0.2}$CoSn | 26.6666 | 0.0000 | 6.6667 | 33.3334 | 33.3333 |
| #4 Nb$_{0.8}$V$_{0.1}$Ta$_{0.1}$CoSn | 26.6667 | 3.3333 | 3.3333 | 33.3334 | 33.3333 |

Figure 15:
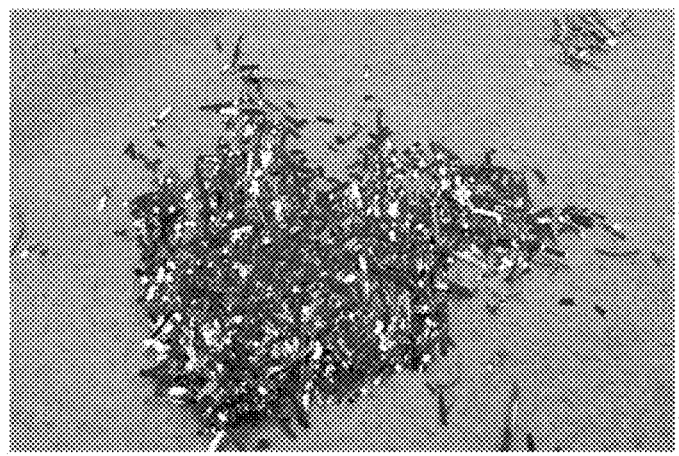
FIG. 15 shows ribbons produced by rapid solidification process of an alloy ingot.

For uniformity of the phase and composition, each alloy ingot was subjected to melt spinning to prepare a quenched specimen. The shape of specimen was a cut ribbon, as shown in FIG. 15. The alloy ingot was melted by induction melting in an inert argon gas atmosphere and injected at a constant pressure on the surface of a copper wheel rotating at a constant linear velocity. The specimen was collected in a collection chamber.

Evaluation
Microstructures

Figure 16:
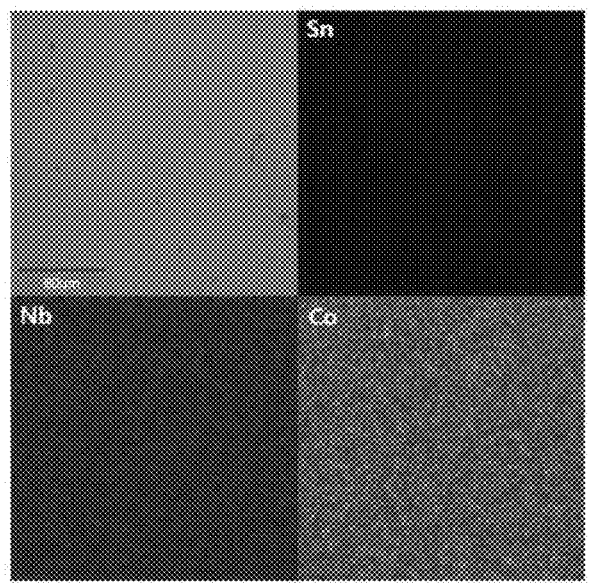
FIG. 16 shows a cross-sectional image of a microstructure of a ribbon specimen, which was taken using a scanning electron microscope equipped with a backscattered electron detector, and the results of energy dispersive spectroscopy mapping for the composition of the microstructure.

FIG. 16 shows a cross-sectional image of the ribbon specimen (#1 NbCoSn), which was taken using a scanning electron microscope equipped with a backscattered electron detector, and the results of energy dispersive spectroscopy mapping for the composition of the ribbon specimen. The results revealed that the microstructure in the matrix approached a single phase and was homogeneous in composition.

Figure 17:
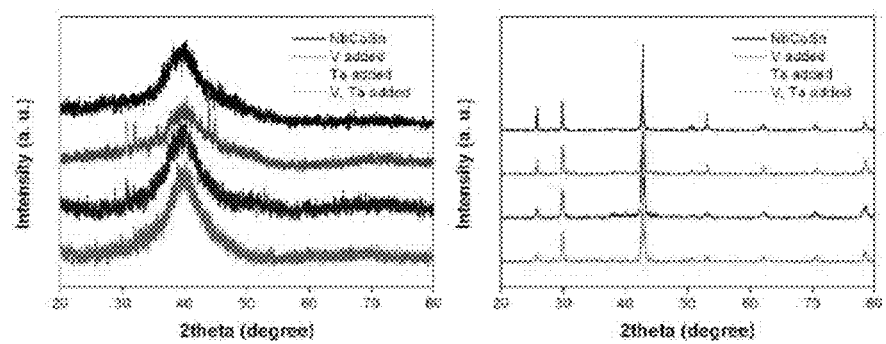
FIG. 17 shows X-ray diffraction (XRD) patterns of as-spun alloys and sintered bulk specimens by using amorphous precursors with various composition according to exemplary embodiments of the present invention.

FIG. 17 shows X-ray diffraction (XRD) patterns of the ribbon specimens having the compositions shown in Table 1. Specifically, the left of FIG. 17 shows XRD patterns of the specimens immediately after quenching ("as-spun") and the right of FIG. 17 shows XRD patterns of the specimens after annealing at 650° C. and subsequent cooling ("HT"). All quenched ribbon specimens (as-spun) had amorphous hollow peaks, which can be observed in amorphous materials. Peaks with high intensities were observed at 20 corresponding to tin in the vanadium-added specimen (#2) and the tantalum-added specimen (#3). However, such strong peaks did not appear in the specimen alloyed with vanadium and tantalum (#4).

Referring to the right of FIG. 17, half-Heusler peaks were observed in all specimens. Peaks corresponding to tin were observed in #2 and #3, as in as-spun. However peaks other than the half-Heusler peaks were not observed in #1 and #4. These results indicate that the solubility of tin decreased with increasing substitution of vanadium and tantalum. These results also suggest that appropriate substitutions of vanadium and tantalum contribute to the formation of uniform single phases by controlling reduction of solubility of tin.

Figure 18:
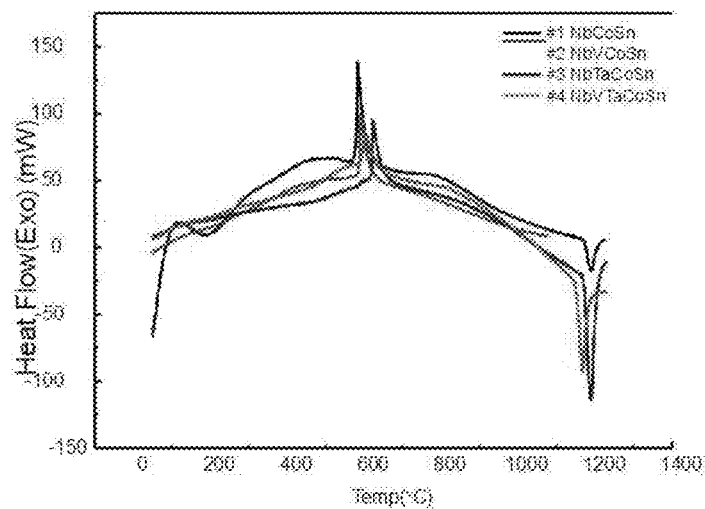
FIG. 18 shows differential scanning calorimetry (DSC) thermograms of as-spun alloys with various composition according to exemplary embodiments of the present invention.

FIG. 18 shows differential scanning calorimetry thermograms of the four quenched ribbon specimens (as-spun). Exothermic peaks were observed in all specimens. Only the crystallization temperatures ($T_x$) and enthalpy changes ($\Delta H$) are summarized in Table 2 among the thermal properties.

TABLE 2

| Sample | $T_x$ (° C.) | $\Delta H$ (J/g) |
|---|---|---|
| #1 NbCoSn | 580.28 | 120.7 |
| #2 NbVCoSn | 587.3 | 96 |
| #3 NbTaCoSn | 619.24 | 85.59 |
| #4 NbVTaCoSn | 592.83 | 67.3 |

The crystallization temperatures of #2, #3, and #4 were higher than that of #1 but the $\Delta H$ of #2, #3, and #4 were lower than that of #1. Considering that the increased $T_x$ is indicative of high thermal stability, the thermal stability of the amorphous matrix of #3 was improved compared to that of #2 but the $\Delta H$ of #3 was lower than that of #2. The thermal stability of #4 lied between those of #2 and #3 but the $\Delta H$ of #4 was lowest. Taken the results shown in FIG. 18 and Table 2 and the XRD results shown in FIG. 17 together, due to secondary phase precipitation during quenching, the decreased amorphous matrix led to a reduction in $\Delta H$ during crystallization and affected the phase uniformity after annealing. However, appropriate control over the composition to suppress the occurrence of a secondary phase during quenching is believed to effectively achieve phase and composition uniformity even in multiple compositions.

The ribbon #1, the one of the specimens whose compositional uniformity was verified, was finely pulverized into a powder by ball milling. The ratio of the balls to the specimen was 15:1. #1 was charged into a ball mill containing tungsten carbide balls in an argon gas atmosphere to minimize contamination, followed by pulverization at 150 RPM. The pulverization times were set to 8, 10, and 12 h to investigate its influence on crystallization.

Figure 19:
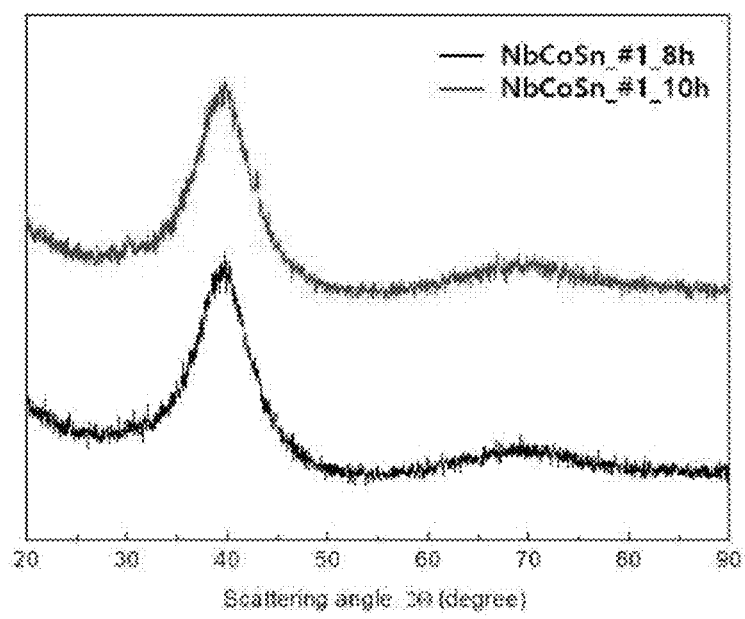
FIG. 19 shows XRD patterns of samples obtained after ball milling of a quenched ribbon specimen for different times (8 and 10 hours)
Figure 20:
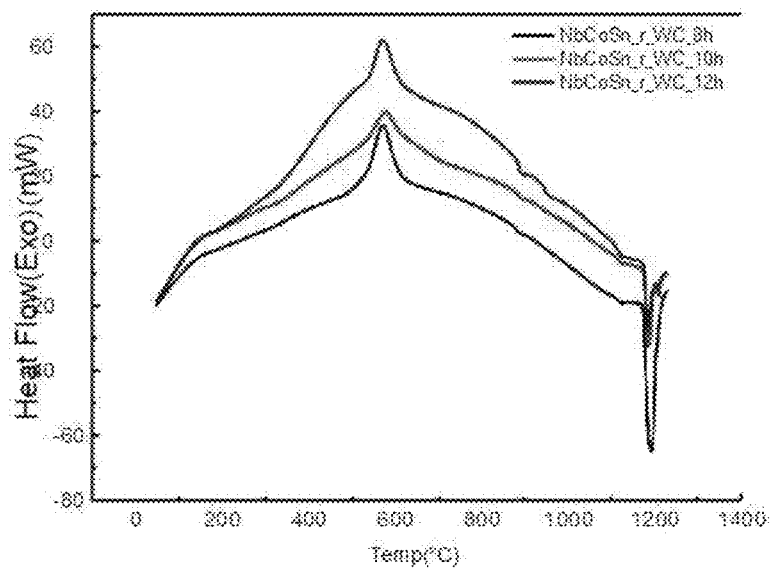
FIG. 20 shows DSC results of specimens for powders obtained after ball milling of quenched NbCoSn ribbons for different times (8, 10, and 12 h)

FIG. 19 shows X-ray diffraction patterns of the powders ("as-BM") obtained by pulverizing the specimen #1 for 8 h and 10 h. Amorphous hollow peaks appeared in all powders, similarly to in the quenched specimen. The results of differential scanning calorimetry thermograms for the samples are shown in FIG. 20 and Table 3.

TABLE 3

| Sample | $T_x$ (° C.) | $\Delta H$ (J/g) |
|---|---|---|
| 8 h | 540.11 | 53.15 |
| 10 h | 546.077 | 50 |
| 12 h | 543.89 | 49.52 |

As the ball milling time increased, the $\Delta H$ gradually decreased. The calorific values of the samples were significantly lower than that of #1 shown in Table 2.

These results indicate that partial crystallization occurred due to the energy transferred to the specimen during ball milling. The results in FIG. 19 indicate the formation of nanocrystals or crystal nuclei with a size smaller than the resolution of the X-ray diffraction system during ball milling. Despite these results, coarse crystal grains were not observed after spark plasma sintering and nano-sized crystal phases were formed, as in the results shown in Example 2 and FIG. 10, suggesting that annealing or process control enables control over the nanophases even after ball milling.

An alloy ingot and a quenched specimen were prepared by the following procedures:

(1) Alloy ingot ("as-cast"): A rod-like specimen with a 3 mm diameter was prepared by vacuum suction casting.

(2) Quenched specimen ("as-pressed"): A fine powder of the specimen prepared by quenching in Example 3 was sintered by hot pressing for its bulking. For sintering, the powder was heated to 700° C., the heating rate was 40° C./min, maintained for 5 min, and cooled in a furnace. A pressure of 50 MPa was maintained during press sintering. The pressure was removed at the start of the furnace cooling.

The thermoelectric properties of the as-cast and the as-pressed specimen were compared.

Characterization

Figure 21:
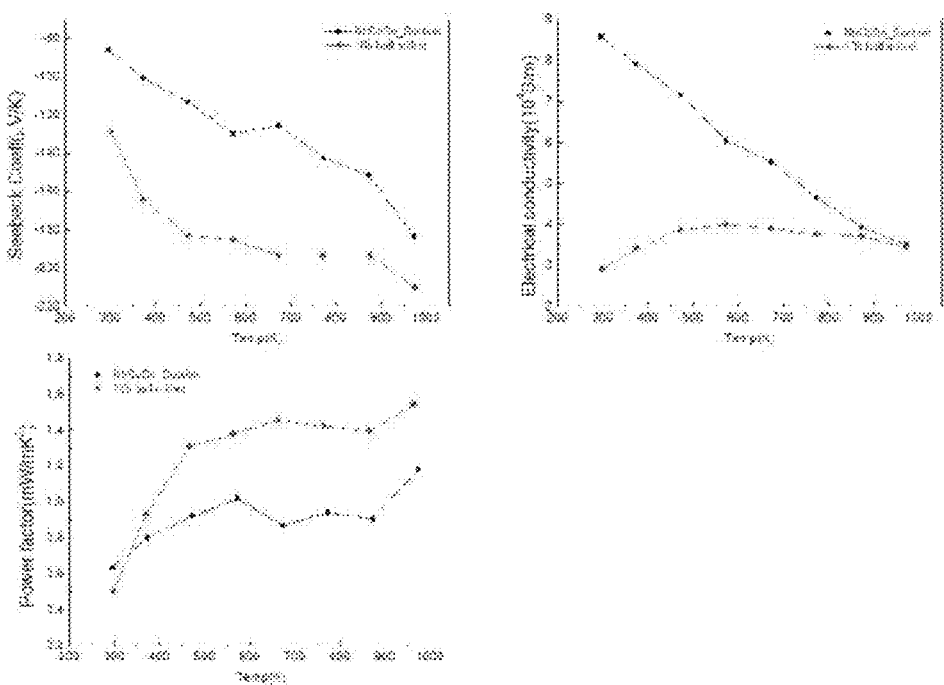
FIG. 21 shows Seebeck coefficients, electrical conductivity, and power factors of sintered bulk specimens of pulverized powders and a rod-shaped alloy ingot specimen.

FIG. 21 shows the electrical conductivities, Seebeck coefficients, and power factors of the two specimens. The Seebeck coefficient of the as-pressed sample was −210 µV/K at 700° C., which was better than that of the as-cast specimen (−182 µV/K), but the electrical conductivities of the as-cast specimen were higher in most of the temperature ranges. However, the power factor, greatly affects the power of the thermoelectric materials, of the as-pressed specimen was greater than that of the as-cast specimen due to the influence of the Seebeck coefficient. The power factor of the as-pressed specimen reached a maximum of 1.4 mW/mK$^2$.

An alloy solidified in a molten state is excellent in terms of electrical conductivity because only a few pores are present and no powder interfaces appear, as in sintered specimens. However, the thermal conductivity term of the alloy significantly increases, resulting in poor thermoelectric properties. The thermal conductivity affects the ZT value, which is indicative of thermoelectric properties. In contrast, a nano-phased specimen has a reduced electrical conductivity due to the formation of pores upon powder sintering, which can be seen from the results obtained through the process conditions presented in this example, but achieves a high Seebeck coefficient through the homogenization and stabilization of the half-Heusler phase, which has thermoelectric properties, resulting in an improved power factor. In addition, the nano-sized crystalline phase boundaries can effectively elicit a reduction in thermal conductivity by phonon scattering, thus being advantageous for improving the ZT value.

Investigation of Crystallization Behaviors According to Pulverization Processes

High thermoelectric performance was achieved in the bulk thermoelectric materials prepared by sintering the powders of the quenched ribbon specimens prepared in Examples 1-3. Here, the crystallization behaviors of the quenched ribbon specimens according to pulverization processes were investigated. The resulting experimental results were added to optimize pulverization conditions.

The quenched ribbon specimen #1 of Example 3 was pulverized under three different conditions in order to exemplify an optimal pulverization process condition through atmosphere and process control. The one of the specimens was pulverized using a ceramic mortar and pestle in an air atmosphere (first conditions). Another specimen was pulverized in a glove box in an inert argon gas atmosphere using a ceramic mortar and pestle (second conditions). The other specimens were pulverized in a ball mill in an inert atmosphere for different times (8 h and 10 h). A total of 4 samples were prepared. X-ray diffraction analysis was conducted to investigate the crystallization tendency of the samples.

Figure 22:
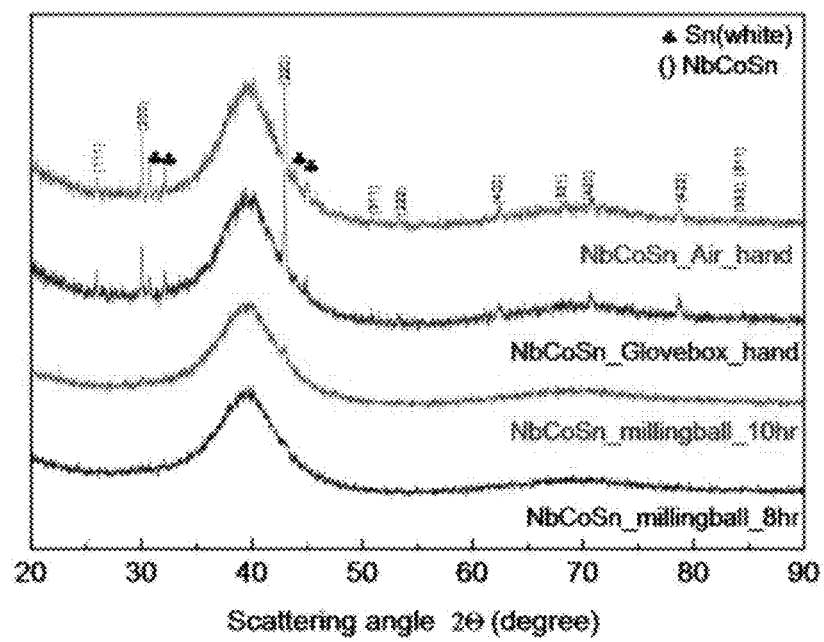
FIG. 22 shows XRD patterns of powders obtained after pulverization of a ribbon having a half-Heusler composition (NbCoSn) by various processes.

The results of X-ray diffraction analysis are shown in FIG. 22. Peaks corresponding to the half-Heusler phase of NbCoSn together with weak peaks corresponding to tin were detected in the two samples having undergone no ball milling. In contrast, no prominent peaks were detected in the quenched ribbon specimen pulverized in a ball mill until 8 h but weak main peaks corresponding to half-Heusler were detected at around 2θ=42° when pulverized for 12 h.

Figure 23:
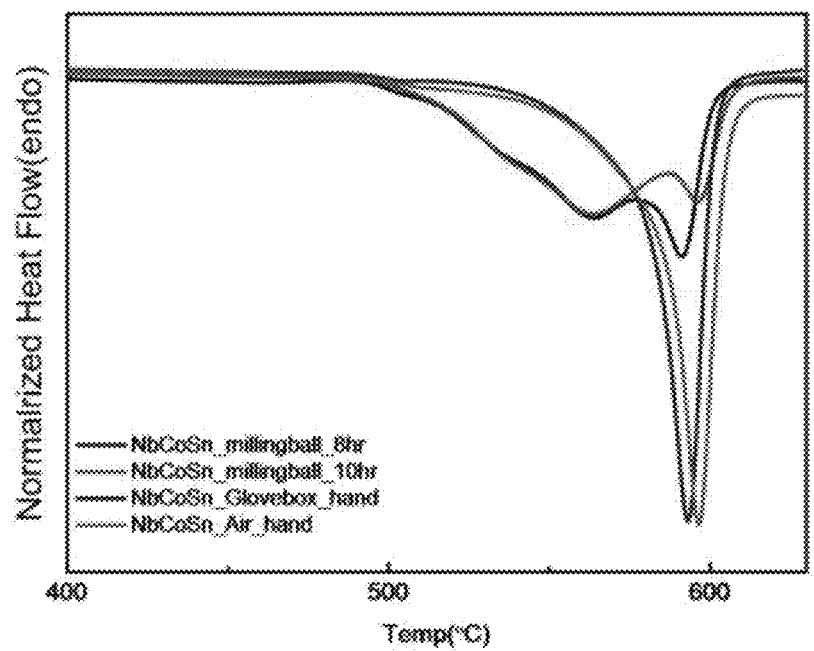
FIG. 23 shows the results of DSC for powders obtained after pulverization of a ribbon having a half-Heusler composition (NbCoSn) by various processes.
Figure 24:
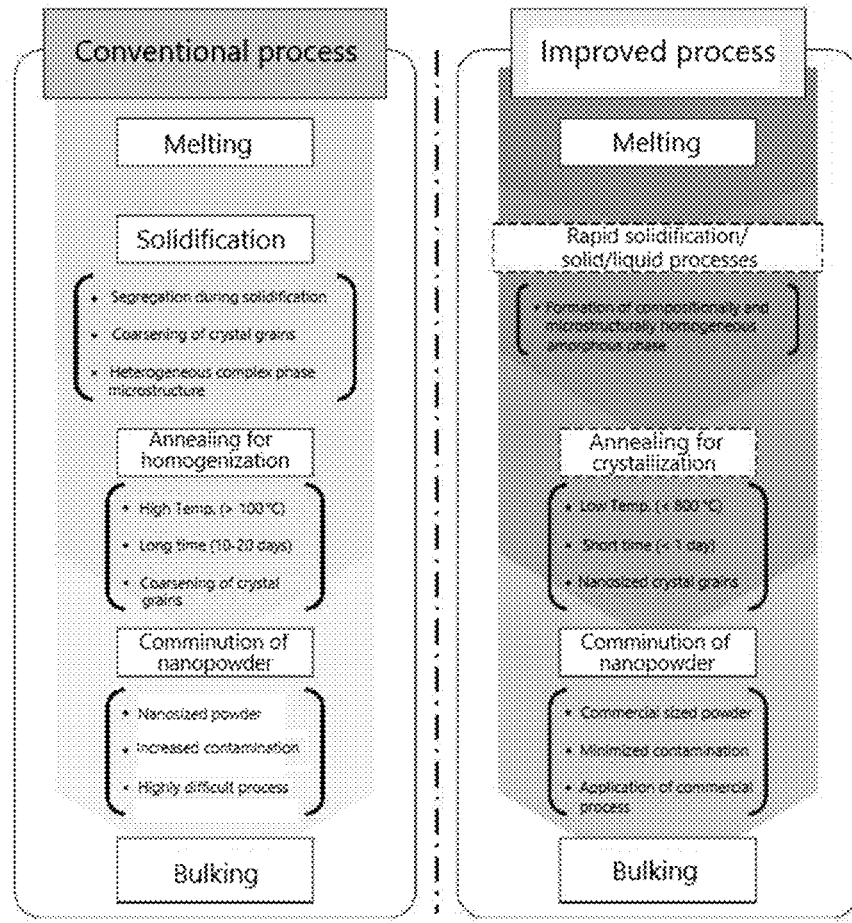
FIG. 24 shows a process flow diagram of a method for producing a half-Heusler thermoelectric material using an amorphous phase according to the present invention.

FIG. 23 and Table 4 show the results of differential scanning calorimetry for the four samples.

TABLE 4

| Sample | $T_x$ (° C.) | ΔH (J/g) |
| --- | --- | --- |
| NbCoSn_millingball_8 hr | 488.93 | −196.601 |
| NbCoSn_millingball_10 hr | 488.63 | −192.209 |
| NbcoSn_Glovebox_hand | 530 | −181.143 |
| NbCoSn_Air_hand | 535.33 | −171.724 |

Here, there were significant differences between the samples prepared by ball milling and the sample prepared by pulverization using a ceramic mortar and pestle. Particularly, as the milling time increased, the ΔH of the samples tended to gradually decrease but the $T_x$ of the sample was hardly changed. At least two exothermic peaks were detected in the samples prepared by ball milling, unlike in the ribbon specimen. The ΔH of the samples prepared by pulverization using a ceramic mortar and pestle were lower than those of the samples prepared by ball milling.

From the results of X-ray diffraction analysis and differential scanning calorimetry, it is believed that crystallization behaviors show up easily at low strain energy during pulverization of the NbCoSn quenched ribbon specimen, leading to phase formation. In contrast, it is believed that a high energy process such as ball milling tends to create a new short-range order in the amorphous matrix or leads to the formation of a microstructure, where a new short-range order takes place, due to the mechanical alloying behavior of impurities separated from the ball mill or milling balls during pulverization.

The quenched ribbon specimen provided in the present invention is easy to pulverize. In addition, the incorporation of impurities into the quenched ribbon specimen can be minimized because low energy is applied although the quenched ribbon specimen is partially crystallized. Therefore, the method of the present invention does not require very clean equipment for mass production, involving no increase in processing cost, and enables the synthesis of a half-Heusler thermoelectric material in an efficient manner.

The features and technical advantages of the present invention have been rather broadly described above so that the scope of the appended claims can be better understood. It will be understood by those skilled in the art that the invention can be implemented in other specific forms without changing the spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A method for producing a Heusler-based phase thermoelectric material, comprising forming an amorphous matrix phase from a liquid phase or a solid phase or a gas phase or a fourth phase and applying thermal energy, mechanical energy or physical energy into the amorphous matrix phase to form thermoelectric phase wherein the thermoelectric phase is represented by Formula 1:

$$X_a Y_b Z_c W_d \qquad (1)$$

wherein X is a metal selected from the group consisting of V, Nb, and Ta, Y is a metal selected from the group consisting of Fe, Co, and Ni, Z is a metal or metalloid selected from the group consisting of Sn and Si, W is a metal or metalloid selected from the group consisting of Sb and Bi, and a, b, c, and d satisfy 0<a≤1, 0<b≤2, 0<c≤1, 0≤d<0.1, respectively, and wherein the amorphous matrix phase is formed by melt spinning, mechanical energy injection, or condensation.

2. The method according to claim 1, wherein the thermoelectric phase is formed using annealing, ball milling, hand milling, laser and/or electric pulse.

3. A method for producing a Heusler-based phase thermoelectric material, comprising forming an amorphous matrix phase from a liquid phase or a solid phase or a gas phase or a fourth phase and applying thermal energy, mechanical energy or physical energy into the amorphous matrix phase to form thermoelectric phase wherein the thermoelectric phase is represented by Formula 1:

$$X_a Y_b Z_c W_d \qquad (1)$$

wherein X is a metal selected from the group consisting of V, Nb, and Ta, Y is a metal selected from the group consisting of Fe, Co, and Ni, Z is a metal or metalloid selected from the group consisting of Sn and Si, W is a metal or metalloid selected from the group consisting of Sb and Bi, and a, b, c, and d satisfy 0<a≤1, 0<b≤2, 0<c≤1, 0≤d<0.1, respectively, and wherein the thermoelectric phase is formed using laser and/or electric pulse.

4. The method according to claim 3, wherein the amorphous matrix phase is formed by rapid solidification, melt spinning, splat quench, gas atomization, water atomization, mechanical alloying, mechanical energy injection, condensation or deposition.

5. A method for producing a Heusler-based phase thermoelectric material, comprising forming an amorphous matrix phase from a liquid phase or a solid phase or a gas phase or a fourth phase and applying thermal energy, mechanical energy or physical energy into the amorphous matrix phase to form thermoelectric phase wherein the thermoelectric phase is represented by Formula 1 consisting of X, Y, Z, and W:

$$X_a Y_b Z_c W_d \quad (1)$$

wherein X is a metal selected from the group consisting of V, Nb, and Ta, Y is a metal selected from the group consisting of Fe, Co, and Ni, Z is a metal or metalloid selected from the group consisting of Sn and Si, W is Bi, and a, b, c, and d satisfy $0<a\leq1$, $0<b\leq2$, $0<c\leq1$, $0<d<0.10$, respectively.

6. The method according to claim 5, wherein the amorphous matrix phase is formed by rapid solidification, melt spinning, splat quench, gas atomization, water atomization, mechanical alloying, mechanical energy injection, condensation or deposition.

7. The method according to claim 5, wherein the thermoelectric phase is formed using annealing, ball milling, hand milling, laser and/or electric pulse.

* * * * *